United States Patent
Mabuchi et al.

(10) Patent No.: US 9,923,024 B1
(45) Date of Patent: Mar. 20, 2018

(54) CMOS IMAGE SENSOR WITH REDUCED CROSS TALK

(71) Applicant: OmniVision Technologies, Inc., Santa Clara, CA (US)

(72) Inventors: Keiji Mabuchi, Los Altos, CA (US);
Sohei Manabe, San Jose, CA (US);
Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/607,309

(22) Filed: May 26, 2017

(51) Int. Cl.
*H01L 27/148* (2006.01)
*H01L 27/146* (2006.01)

(52) U.S. Cl.
CPC .. *H01L 27/14812* (2013.01); *H01L 27/14634* (2013.01)

(58) Field of Classification Search
CPC ............... H01L 27/14812; H01L 27/14634
USPC .......................................................... 257/233
See application file for complete search history.

(56) References Cited

U.S. PATENT DOCUMENTS 8,384,178 B2    2/2013  Mabuchi
9,537,028 B2 *  1/2017  De Munck ........ H01L 31/03529

* cited by examiner

*Primary Examiner* — Tu-Tu Ho

(57) ABSTRACT

An imaging sensor pixel comprises a highly resistive N⁻ doped semiconductor layer with a front side and a back side. At the front side, there are at least a light sensing region, a transfer gate adjacent to the light sensing region and a P-well region. The P-well region surrounds the light sensing region and the transfer gate region, and comprises at least a floating diffusion region and a first electrode outside of the floating diffusion region, wherein a first negative voltage is applied to the first electrode. The transfer gate couples between the light sensing region and the floating diffusion region. At the back side, there is a back side P⁺ doped layer comprising a second electrode formed on the back side P⁺ doped layer, wherein a second negative voltage is applied to the second electrode. The second negative voltage is more negative than the first negative voltage.

22 Claims, 3 Drawing Sheets

CMOS IMAGE SENSOR WITH REDUCED CROSS TALK

TECHNICAL FIELD

This disclosure relates generally to semiconductor image sensors, and in particular but not exclusively, relates to CMOS image sensors with reduced cross talk.

BACKGROUND INFORMATION

Image sensors have become ubiquitous. They are widely used in digital still cameras, cellular phones, security cameras, as well as medical, automobile and other applications. The typical image sensor operates as follows. Image light from an external scene is incident on the image sensor. The image sensor includes a plurality of photosensitive elements such that each photosensitive element absorbs a portion of the incident image light. Each photosensitive element included in the image sensor, such as photodiodes, generates image charges upon absorption of the image light. The amount of generated image charges is proportional to the intensity of the image light. The generated image charges may be used to produce an image representing the external scene.

The device architecture of image sensors has continued to advance at a great pace due to increasing demands for higher resolution, lower power consumption, increased dynamic range, etc. These demands have also encouraged the further miniaturization and integration of image sensors into these devices. The miniaturization of image sensors may result in a decreased distance between neighboring photosensitive elements. As the distance between photosensitive elements decreases, the likelihood and magnitude of optical and electrical crosstalk between photosensitive elements may increase.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
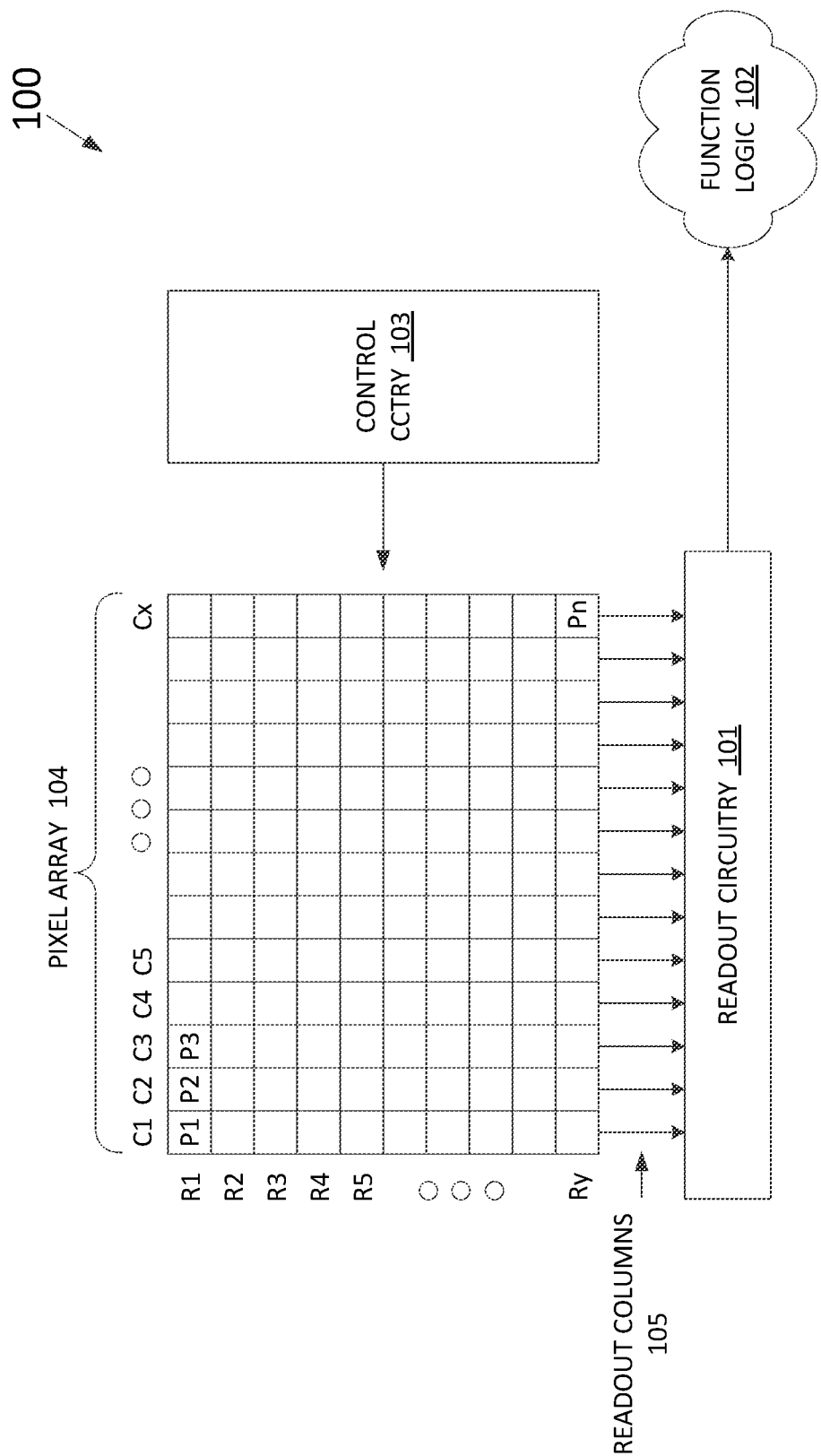
FIG. 1 is a block diagram schematically illustrating one example of an imaging system, in accordance with an embodiment of the disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with improved cross talk are described herein. In the following description, numerous specific details are set forth to provide a thorough understanding of the examples. However, one skilled in the relevant art will recognize that the techniques described herein can be practiced without one or more of the specific details, or with other methods, components, materials, etc. In other instances, well-known structures, materials, or operations are not shown or described in details in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 is a block diagram illustrating one example of imaging system 100. Imaging system 100 includes pixel array 104, control circuitry 103, readout circuitry 101, and function logic 102. In one example, pixel array 104 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and may take other configurations.

In one example, after the image sensor photodiode/pixel in pixel array 104 has acquired its image data or image charge, the image data is readout by readout circuitry 101 and then transferred to functional logic 102. In various examples, readout circuitry 101 may include amplification circuitry, analog-to-digital (ADC) conversion circuitry, or otherwise. Function logic 102 may simply store the image data or even manipulate the image data by applying post image effects (e.g., crop, rotate, remove red eye, adjust brightness, adjust contrast, or otherwise). In one example, readout circuitry 101 may read out a row of image data at a time along readout column lines (illustrated) or may readout the image data using a variety of other techniques (not illustrated), such as a serial readout or a full parallel readout of all pixels simultaneously.

In one example, control circuitry 103 is coupled to pixel array 104 to control operation of the plurality of photodiodes in pixel array 104. For example, control circuitry 103 may generate a shutter signal for controlling image acquisition. In one example, the shutter signal is a global shutter signal for simultaneously enabling all pixels within pixel array 104 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, automobile or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
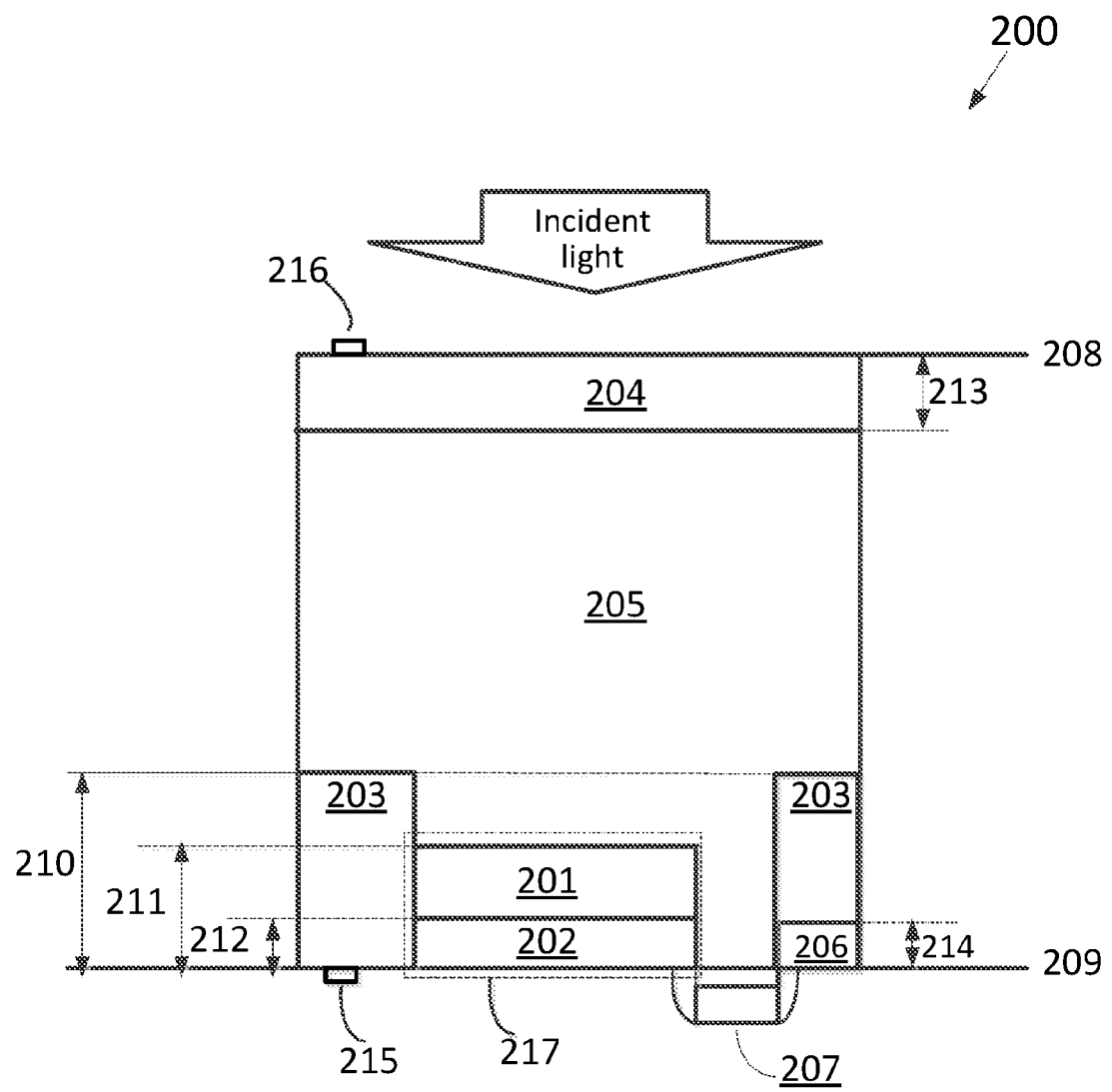
FIG. 2 is a cross-sectional view of an imaging sensor pixel of a backside illuminated imaging sensor, in accordance with an embodiment of the invention.

FIG. 2 is a cross-sectional view of an imaging sensor pixel 200 of a backside illuminated imaging sensor, in accordance with an embodiment of the invention. The imaging sensor pixel 200 is one possible implementation of at least one pixel of pixel array 104 shown in FIG. 1. The illustrated embodiment of the imaging sensor pixel 200 includes a highly resistive N⁻ doped semiconductor layer 205 which has a front side surface 209 and a back side surface 208, wherein an incident light is received from the back side surface 208. The highly resistive N⁻ doped semiconductor layer 205 comprises a semiconductor material with a concentration of a N type dopant in the range of approximately zero to $1\times10^{15}$ ions/cm³. In this example, it is desirable to use a highly resistive substrate close to an intrinsic semiconductor for the semiconductor layer 205 in order to sufficiently reduce the dark current and the electric cross talk between two adjacent pixels.

At the front side of the highly resistive N⁻ doped semiconductor layer 205, there are at least a light sensing region 217, a transfer gate 207 and a P-well region 203.

The light sensing region 217 comprises a photodiode (PD) N doped region 201 as a photoelectric converting region of the PD and a front side P⁺ doped layer 202 as a pinning layer which helps to reduce the hot electron induced dark current at the front side surface. The photodiode (PD) N doped region 201 has a concentration of a N type dopant extending from a first distance 212 from a front side surface 209 of the semiconductor layer 205 to a second distance 211 from the front side surface 209 of the semiconductor lay 205. A front side P⁺ doped layer 202 vertically aligned with the PD N doped region 201 wherein the front side P⁺ doped layer 202 has a second concentration of a P type dopant extending from the front side surface 209 of the semiconductor layer 205 to the first distance 212 from the front side surface 209 of the semiconductor layer 205, wherein the first distance 212 is shorter than the second distance 211. In one example, the concentration of the N type dopant is in the range of approximately $1\times10^{16}$ ions/cm³ to $1\times10^{18}$ ions/cm³, the concentration of the P type dopant is in the range of approximately $1\times10^{18}$ ions/cm³ to $1\times10^{21}$ ions/cm³, the second distance 211 is in the range of approximately 1000 A to 5000 A and the first distance 212 is approximately 10 A to 500 A.

The P-well region 203 is formed as a device forming region for the image sensor pixel devices. It surrounds the light sensing region 217 and the transfer gate 207. Within the P-well region 203, there are at least a floating diffusion region 206 and a first electrode 215 which has no contact with the floating diffusion region 206. The transfer gate 207 is coupled between the photodiode (PD) N doped region 201 and the floating diffusion region 206 to output signal charges accumulated in the photodiode (PD) N doped region 201 to the floating diffusion region 206.

The P-well region 203 has a concentration of a P type dopant extends from the front side surface 209 to a third distance 210 from the front side surface 209, wherein the third distance 210 is longer than the second distance 211. In one example, the concentration of the P type dopant is in the range of approximately $1\times10^{15}$ ions/cm³ to $1\times10^{17}$ ions/cm³, and the third distance 210 is in the range of approximately 0.5 to 2 micron.

The floating diffusion region 206 has a concentration of a N type dopant extending from the front side surface 209 to a fourth distance 214 from the front side surface 209, and the fourth distance 214 is shorter than the third distance 210. In one example, the concentration of the N dopant is in the range of approximately $1\times10^{18}$ ions/cm³ to $1\times10^{21}$ ions/cm³ and the fourth distance 214 is in the range of approximately 10 A to 500 A.

At the back side of the highly resistive N⁻ doped semiconductor layer 205, there is a back side P⁺ doped layer 204 where a second electrode 216 is formed. The back side P⁺ doped layer 204 creates an electric field near the back side surface 208 in order to separate the electron-hole pairs created by photon absorption at the back side surface 208 and drive the electrons to the photodiode (PD) N doped region 201. The back side P⁺ doped layer 204 has a concentration of a P type dopant extending from the back side surface 208 to a fifth distance 213 from the back side surface 208. In one example, the concentration of the P type dopant is in the range of approximately $1\times10^{17}$ ions/cm³ to $1\times10^{20}$ ions/cm³, and the fifth distance 213 is in the range of approximately 10 to 1000 A. There is no overlap between the back side P⁺ doped layer 204 and the front side P-well region 203.

The N type dopant comprises any of As, P, As derived from a AsH3 source, and P derived from a PH3 source. The P type dopant comprises any of Boron (B), Boron fluoride (BF2), B derived from a B2H6 source, and B derived from a BF3 source. The N type doping and P type doping may be implemented by ion beam implantation or Plasma implantation. Thermal anneal or laser anneal may be implemented to activate N type and P type dopants. In another example, the back side P⁺ doped layer 204 may be formed on the back side surface 208 of the semiconductor layer 205 by depositing any of negatively charged materials on the back side surface 208.

The first electrode 215 at the P-well region 203 is biased by a first negative voltage while the second electrode 216 at the back side P⁺ doped layer 204 is biased by a second negative voltage, wherein the second negative voltage is intentionally setup to be more negative than the first negative voltage. In one example, the first negative voltage is approximately −1V and the second negative voltage is approximately −4V. Therefore, an electric field is generated within the highly resistive N⁻ doped semiconductor layer 205. Such electric field has a direction to drive the photoelectrons toward the photodiode (PD) N doped region 201 and make it more difficult for the photoelectrons to enter the adjacent pixels. Meanwhile, holes generated by the photoelectric conversion in conjunction with the electrons are also drifted toward the second electrodes 216 and absorbed there. Therefore, the electric cross talk between adjacent pixels can be reduced. Moreover, since the P-well region 203 is negatively biased instead of grounded, the potential value of the overflow path may be maintained at a normal value, such as 0.5V in this example, without degrading the full well capacity of the floating diffusion region 206. As a result, the blooming effect can be reduced as well.

In one example, the first electrode 215 and the second electrode 216 may be formed by any of metal silicide, metal alloy and transparent conductors.

Figure 3:
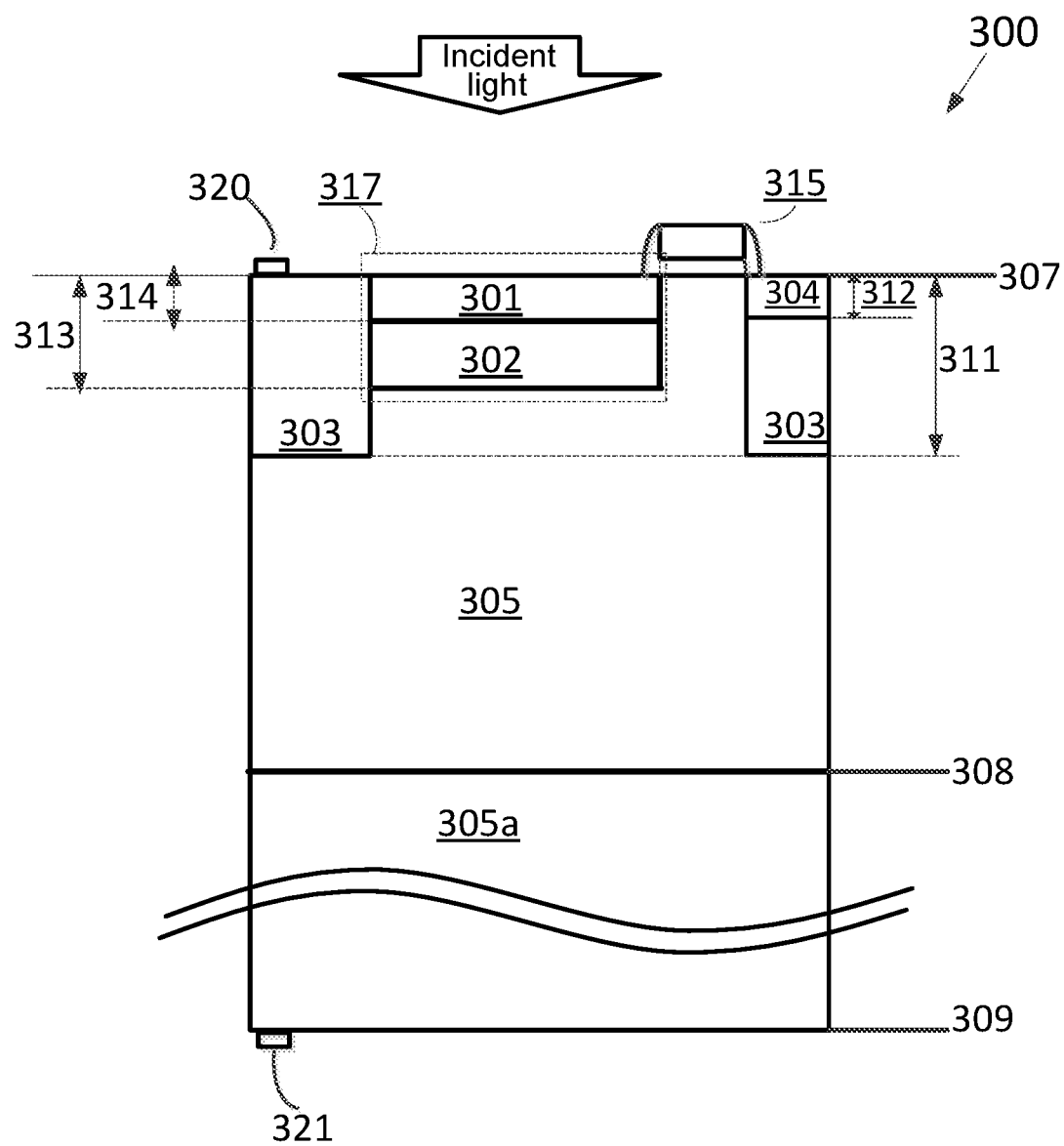
FIG. 3 is a cross-sectional view of an imaging sensor pixel of a front side illuminated imaging sensor, in accordance with an embodiment of the invention.

FIG. 3 is a cross-sectional view of an imaging sensor pixel 300 of a front side illuminated imaging sensor, in accordance with an embodiment of the invention. The imaging sensor pixel 300 is one possible implementation of at least one pixel of pixel array 104 shown in FIG. 1. The illustrated embodiment of the imaging sensor pixel 300 includes a highly resistive N⁻ doped semiconductor layer 305 which may be an epitaxial layer grown on the top of a P type semiconductor substrate 305a wherein a second electrode 321 is coupled to the P type semiconductor substrate 305a. The P type semiconductor substrate 305a has a back side surface 309. The highly resistive N⁻ doped semiconductor layer 305 has a front side surface 307 wherein an incident light is received from. There is an interface 308 between the highly resistive N⁻ doped semiconductor layer 305 and the P type semiconductor substrate 305a. In one example, the highly resistive N⁻ doped semiconductor layer 305 has a thickness in the range of approximately 3 micron to 10 micron, and a concentration of a N type dopant in the range of approximately zero to $1 \times 10^{15}$ ions/cm³. The P type semiconductor substrate 305a has a thickness in the range of approximately 100 micron to 1000 micron, and a concentration of a P type dopant in the range of approximately $1 \times 10^{16}$ to $1 \times 10^{19}$ ions/cm³. In this example, it is desirable to use a highly resistive substrate close to an intrinsic semiconductor for the semiconductor layer 305 in order to sufficiently reduce the dark current and the electric cross talk between two adjacent pixels.

At the front side of the highly resistive N⁻ doped semiconductor layer 305, there are at least a light sensing region 317, a transfer gate 315 and a P-well region 303.

The light sensing region 317 comprises a photodiode (PD) N doped region 302 as a photoelectric converting region of the PD and a front side P⁺ doped layer 301 as a pinning layer which helps to reduce the hot electron induced dark current at the front side surface. The photodiode (PD) N doped region 302 has a concentration of a N type dopant extending from a first distance 314 from a front side surface 307 of the semiconductor layer 305 to a second distance 313 from the front side surface 307 of the semiconductor lay 305. A front side P⁺ doped layer 301 vertically aligned with the PD N doped region 302 wherein the front side P⁺ doped layer 301 has a second concentration of a P type dopant extending from the front side surface 307 of the semiconductor layer 305 to the first distance 314 from the front side surface 307 of the semiconductor layer 305, wherein the first distance 314 is shorter than the second distance 313. In one example, the concentration of the N type dopant is in the range of approximately $1 \times 10^{16}$ ions/cm³ to $1 \times 10^{18}$ ions/cm³, the concentration of the P type dopant is in the range of approximately $1 \times 10^{18}$ ions/cm³ to $1 \times 10^{2}$ ions/cm³, the first distance 313 is in the range of approximately 1000 A to 5000 A and the second distance 314 is approximately 10 A to 500 A.

The P-well region 303 is formed as a device forming region for the image sensor pixel devices. It surrounds the light sensing region 317 and the transfer gate 315. Within the P-well region 303, there are at least a floating diffusion region 304 and a first electrode 320 which is outside of the floating diffusion region 304. The transfer gate 315 couples between the light sensing region 317 and the floating diffusion region 304 to output signal charges accumulated in the PD N doped region 302 to the floating diffusion region 304.

The P-well region 303 has a concentration of a P type dopant extends from the front side surface 307 to a third distance 311 from the front side surface 307, wherein the third distance 311 is longer than the first distance 313. In one example, the concentration of the P type dopant is in the range of approximately $1 \times 10^{15}$ ions/cm³ to $1 \times 10^{17}$ ions/cm³, and the third distance 311 is in the range of approximately 0.5 to 2 micron.

The floating diffusion region 304 has a concentration of a N type dopant extending from the front side surface 307 to a fourth distance 312 from the front side surface 307, and the fourth distance 312 is shorter than the third distance 311. In one example, the concentration of the N dopant is in the range of approximately $1 \times 10^{18}$ ions/cm³ to $1 \times 10^{21}$ ions/cm³ and the fourth distance 312 is in the range of approximately 10 A to 500 A.

The N type dopant comprises any of As, P, As derived from a AsH3 source, and P derived from a PH3 source. The P type dopant comprises any of Boron (B), Boron fluoride (BF2), B derived from a B2H6 source, and B derived from a BF3 source. The N type doping and P type doping may be implemented by ion beam implantation or Plasma implantation. Thermal anneal or laser anneal may be implemented to activate N type and P type dopants.

The first electrode 320 at the P-well region 303 is biased by a first negative voltage while the second electrode 321 coupled to the back side surface 309 of P semiconductor substrate 305a is biased by a second negative voltage, wherein the second negative voltage is intentionally setup to be more negative than the first negative voltage. In one example, the first negative voltage is approximately −1V and the second negative voltage is approximately −4V. Therefore, an electric field is generated within the highly resistive N⁻ doped semiconductor layer 305. Such electric field has a direction to drive the photoelectrons toward the photodiode (PD) N doped region 302 and make it more difficult for the photoelectrons to enter the adjacent pixels. Meanwhile, holes generated by the photoelectric conversion in conjunction with the electrons are also drifted toward the second electrodes 321 and absorbed there. Therefore, the electrical cross talk between adjacent pixels can be reduced. Moreover, since the P-well region 303 is negatively biased instead of grounded, the potential value of the overflow path may be maintained at a normal value, such as 0.5V in this example, without degrading the full well capacity of the floating diffusion region 304. As a result, the blooming effect can be reduced as well.

In one example, the first electrode 320 and the second electrode 321 comprise any of metal silicide, metal alloy and transparent conductors.

In one example, the image sensor pixels and the analog circuits are formed at the same wafer, wherein the image sensor pixels are placed in the negatively biased P-well regions while the analog circuits are placed in the grounded P-well regions. Especially, bias current circuits for pixels are located in the grounded P-well regions. In another example, the image sensor pixels and the analog circuits are formed at two separated wafers so as to apply different bias on their P-well regions more conveniently. In one example, the image sensor pixels are placed at a first wafer with the negatively biased P-well regions, and the analog circuits are placed at a second wafer with the grounded P-well regions. The first wafer and the second wafer are bonded by any kinds of stacking technology, wherein the bonding interface comprises metal and dielectric materials.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An imaging sensor pixel comprising:
   a highly resistive $N^-$ doped semiconductor layer having a front side and a back side;
   a light sensing region formed at the front side;
   a transfer gate formed at the front side adjacent to the light sensing region;
   a P-well region formed at the front side surrounding the light sensing region and the transfer gate;
   a floating diffusion region formed within the P-well region wherein the transfer gate is configured to couple between the light sensing region and the floating diffusion region;
   a first electrode coupled to the P-well region, wherein the first electrode has no contact with the floating diffusion region, and wherein a first negative voltage is applied to the first electrode;
   a back side $P^+$ doped layer formed at the back side; and
   a second electrode coupled to the back side $P^+$ doped layer, wherein a second negative voltage is applied to the second electrode, and the second negative voltage is more negative than the first negative voltage.

2. The imaging sensor pixel of claim 1, wherein the light sensing region comprises:
   a photodiode (PD) N doped region having a first concentration of a first dopant extending from a first distance from a front side surface of the highly resistive $N^-$ doped semiconductor layer to a second distance from the front side surface of the highly resistive $N^-$ doped semiconductor layer; and
   a front side $P^+$ doped layer vertically aligned with the PD N doped region wherein the front side $P^+$ doped layer has a second concentration of a second dopant extending from the front side surface of the highly resistive $N^-$ doped semiconductor layer to the first distance from the front side surface of the highly resistive $N^-$ doped semiconductor layer, wherein the first distance is shorter than the second distance.

3. The imaging sensor pixel of claim 2, the P-well region comprising a third concentration of the second dopant extending from the front side surface of the highly resistive $N^-$ doped semiconductor layer to a third distance from the front side surface of the highly resistive $N^-$ doped semiconductor layer, wherein the second distance is shorter than the third distance.

4. The imaging sensor pixel of claim 3, the floating diffusion region comprising a fourth concentration of the first dopant extending from the front side surface of the highly resistive $N^-$ doped semiconductor layer to a fourth distance from the front side surface of the highly resistive $N^-$ doped semiconductor layer, wherein the fourth distance is shorter than the third distance.

5. The imaging sensor pixel of claim 3, the back side $P^+$ doped layer comprising a fifth concentration of the second dopant, and extending from a back side surface of the highly resistive $N^-$ doped semiconductor layer to a fifth distance from the back side surface of the highly resistive $N^-$ doped semiconductor layer, wherein a profile of the fifth concentration does not overlap with a profile of the third concentration.

6. The imaging sensor pixel of claim 1, wherein the back side $P^+$ doped layer is formed by depositing a negatively charged material deposited on the back side surface of the highly resistive $N^-$ doped semiconductor layer.

7. The imaging sensor pixel of claim 1, wherein the first electrode comprising a transparent conductor.

8. The imaging sensor pixel of claim 1, wherein the second electrode comprising a transparent conductor.

9. The imaging sensor pixel of claim 1, wherein an incident light is received through the front side surface of the highly resistive $N^-$ doped semiconductor layer.

10. The imaging sensor pixel of claim 1, wherein an incident light is received through the back side surface of the highly resistive $N^-$ doped semiconductor layer.

11. The imaging sensor pixel of claim 9, wherein the highly resistive $N^-$ doped semiconductor layer is an epitaxial layer.

12. An imaging sensor system comprising a plurality of image sensor pixels and an analog circuitry, wherein each image sensor pixel comprising:
    a highly resistive $N^-$ doped semiconductor layer having a front side and a back side;
    a light sensing region formed at the front side;
    a transfer gate formed at the front side adjacent to the light sensing region;
    a P-well region formed at the front side surrounding the light sensing region and the transfer gate;
    a floating diffusion region formed within the P-well region wherein the transfer gate is configured to couple between the light sensing region and the floating diffusion region;
    a first electrode coupled to the P-well region, wherein the first electrode has no contact with the floating diffusion region, and wherein a first negative voltage is applied to the first electrode;
    a back side $P^+$ doped layer formed at the back side; and
    a second electrode coupled to the back side $P^+$ doped layer, wherein a second negative voltage is applied to the second electrode, and the second negative voltage is more negative than the first negative voltage.

13. The imaging sensor pixel of claim 12, wherein the light sensing region comprises:
    a photodiode (PD) N doped region having a first concentration of a first dopant extending from a first distance from a front side surface of the highly resistive $N^-$ doped semiconductor layer to a second distance from the front side surface of the highly resistive $N^-$ doped semiconductor layer; and
    a front side $P^+$ doped layer vertically aligned with the PD N doped region wherein the front side $P^+$ doped layer has a second concentration of a second dopant extending from the front side surface of the highly resistive $N^-$ doped semiconductor layer to the first distance from the front side surface of the highly resistive $N^-$ doped semiconductor layer, wherein the first distance is shorter than the second distance.

14. The imaging sensor pixel of claim 13, the P-well region comprising a third concentration of the second dopant extending from the front side surface of the highly resistive $N^-$ doped semiconductor layer to a third distance from the front side surface of the highly resistive $N^-$ doped semiconductor layer, wherein the second distance is shorter than the third distance.

15. The imaging sensor pixel of claim 14, the floating diffusion region comprising a fourth concentration of the first dopant extending from the front side surface of the highly resistive $N^-$ doped semiconductor layer to a fourth distance from the front side surface of the highly resistive $N^-$ doped semiconductor layer, wherein the fourth distance is shorter than the third distance.

16. The imaging sensor pixel of claim 14, the back side $P^+$ doped layer comprising a fifth concentration of the second dopant, and extending from a back side surface of the highly resistive $N^-$ doped semiconductor layer to a fifth distance from the back side surface of the highly resistive $N^-$ doped semiconductor layer, wherein a profile of the fifth concentration does not overlap with a profile of the third concentration.

17. The imaging sensor pixel of claim 12, the back side $P^+$ doped layer is formed by depositing a negatively charged material deposited on the back side surface of the highly resistive $N^-$ doped semiconductor layer.

18. The imaging sensor pixel of claim 12, wherein an incident light is received through the front side surface of the highly resistive $N^-$ doped semiconductor layer.

19. The imaging sensor pixel of claim 12, wherein an incident light is received through the back side surface of the highly resistive $N^-$ doped semiconductor layer.

20. The imaging sensor pixel of claim 18, wherein the highly resistive $N^-$ doped semiconductor layer is an epitaxial layer.

21. The image sensor system of claim 12, wherein the analog circuitry includes a grounded P-well region.

22. The image sensor system of claim 12, wherein the plurality of image sensor pixels are formed in a first wafer and the analog circuitry is formed in a second wafer, wherein the first wafer and the second wafer are bonded together by stacking.

* * * * *

UNITED STATES PATENT AND TRADEMARK OFFICE
CERTIFICATE OF CORRECTION

PATENT NO. : 9,923,024 B1
APPLICATION NO. : 15/607309
DATED : March 20, 2018
INVENTOR(S) : Keiji Mabuchi, Sohei Manabe and Duli Mao It is certified that error appears in the above-identified patent and that said Letters Patent is hereby corrected as shown below:

In the Claims

Claim 13, Column 8, Line 45, delete "pixel" and substitute therefor --system--;

Claim 14, Column 8, Line 61, delete "pixel" and substitute therefor --system--;

Claim 15, Column 9, Line 1, delete "pixel" and substitute therefor --system--;

Claim 16, Column 9, Line 8, delete "pixel" and substitute therefor --system--;

Claim 17, Column 9, Line 16, delete "pixel" and substitute therefor --system--;

Claim 18, Column 10, Line 1, delete "pixel" and substitute therefor --system--;

Claim 19, Column 10, Line 4, delete "pixel" and substitute therefor --system--;

Claim 20, Column 10, Line 7, delete "pixel" and substitute therefor --system--;

Claim 21, Column 10, Line 10, delete "image" and substitute therefor --imaging--;

Claim 22, Column 10, Line 12, delete "image" and substitute therefor --imaging--.

Signed and Sealed this
Ninth Day of July, 2019

Andrei Iancu
*Director of the United States Patent and Trademark Office*